US011569173B2

United States Patent
Collins et al.

(10) Patent No.: US 11,569,173 B2
(45) Date of Patent: Jan. 31, 2023

(54) BRIDGE HUB TILING ARCHITECTURE

(71) Applicant: Intel Corporation, Santa Clara, CA (US)

(72) Inventors: Andrew P. Collins, Chandler, AZ (US); Digvijay A. Raorane, Chandler, AZ (US); Wilfred Gomes, Portland, OR (US); Ravindranath V. Mahajan, Chandler, AZ (US); Sujit Sharan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/857,752

(22) Filed: Dec. 29, 2017

(65) Prior Publication Data
US 2019/0206798 A1    Jul. 4, 2019

(51) Int. Cl.
*H01L 23/538* (2006.01)
*H01L 23/48* (2006.01)
(Continued)

(52) U.S. Cl.
CPC ...... *H01L 23/5386* (2013.01); *H01L 21/4846* (2013.01); *H01L 21/50* (2013.01);
(Continued)

(58) Field of Classification Search
None
See application file for complete search history.

(56) References Cited

U.S. PATENT DOCUMENTS

2005/0040509 A1* 2/2005 Kikuchi ............... H01L 21/563
257/686
2006/0095639 A1* 5/2006 Guenin ............... H01L 25/0655
710/310
(Continued)

OTHER PUBLICATIONS

Extended European Search Report in European Patent Application No. 18209345, dated Mar. 7, 2019, 10 pages.
(Continued)

*Primary Examiner* — Anthony Ho
*Assistant Examiner* — Kevin Quinto
(74) *Attorney, Agent, or Firm* — Schwabe, Williamson & Wyatt, P.C.

(57) ABSTRACT

Systems and methods of conductively coupling at least three semiconductor dies included in a semiconductor package using a multi-die interconnect bridge that is embedded, disposed, or otherwise integrated into the semiconductor package substrate are provided. The multi-die interconnect bridge is a passive device that includes passive electronic components such as conductors, resistors, capacitors and inductors. The multi-die interconnect bridge communicably couples each of the semiconductor dies included in the at least three semiconductor dies to each of at least some of the remaining at least three semiconductor dies. The multi-die interconnect bridge occupies a first area on the surface of the semiconductor package substrate. The smallest of the at least three semiconductor dies coupled to the multi-die interconnect bridge 120 occupies a second area on the surface of the semiconductor package substrate, where the second area is greater than the first area.

21 Claims, 9 Drawing Sheets

(51) Int. Cl.
*H01L 25/065* (2006.01)
*H01L 21/48* (2006.01)
*H01L 21/50* (2006.01)
*H01L 25/18* (2006.01)

(52) U.S. Cl.
CPC .......... *H01L 23/48* (2013.01); *H01L 23/5385* (2013.01); *H01L 25/0655* (2013.01); *H01L 25/18* (2013.01)

(56) References Cited

U.S. PATENT DOCUMENTS

| | | | |
|---|---|---|---|
| 2007/0262427 A1* | 11/2007 | Koide | H01L 23/04 |
| | | | 257/675 |
| 2010/0327424 A1* | 12/2010 | Braunisch | H01L 23/13 |
| | | | 257/692 |
| 2011/0062575 A1* | 3/2011 | Lin | H01L 23/13 |
| | | | 257/690 |
| 2015/0077173 A1* | 3/2015 | Goodnow | H01L 25/0657 |
| | | | 327/530 |
| 2015/0116965 A1 | 4/2015 | Kim et al. | |
| 2017/0062353 A1* | 3/2017 | Tang | H01L 23/552 |

OTHER PUBLICATIONS

Office Action from European Patent Application No. 18209345.0 dated Apr. 21, 2021, 8 pages.

* cited by examiner

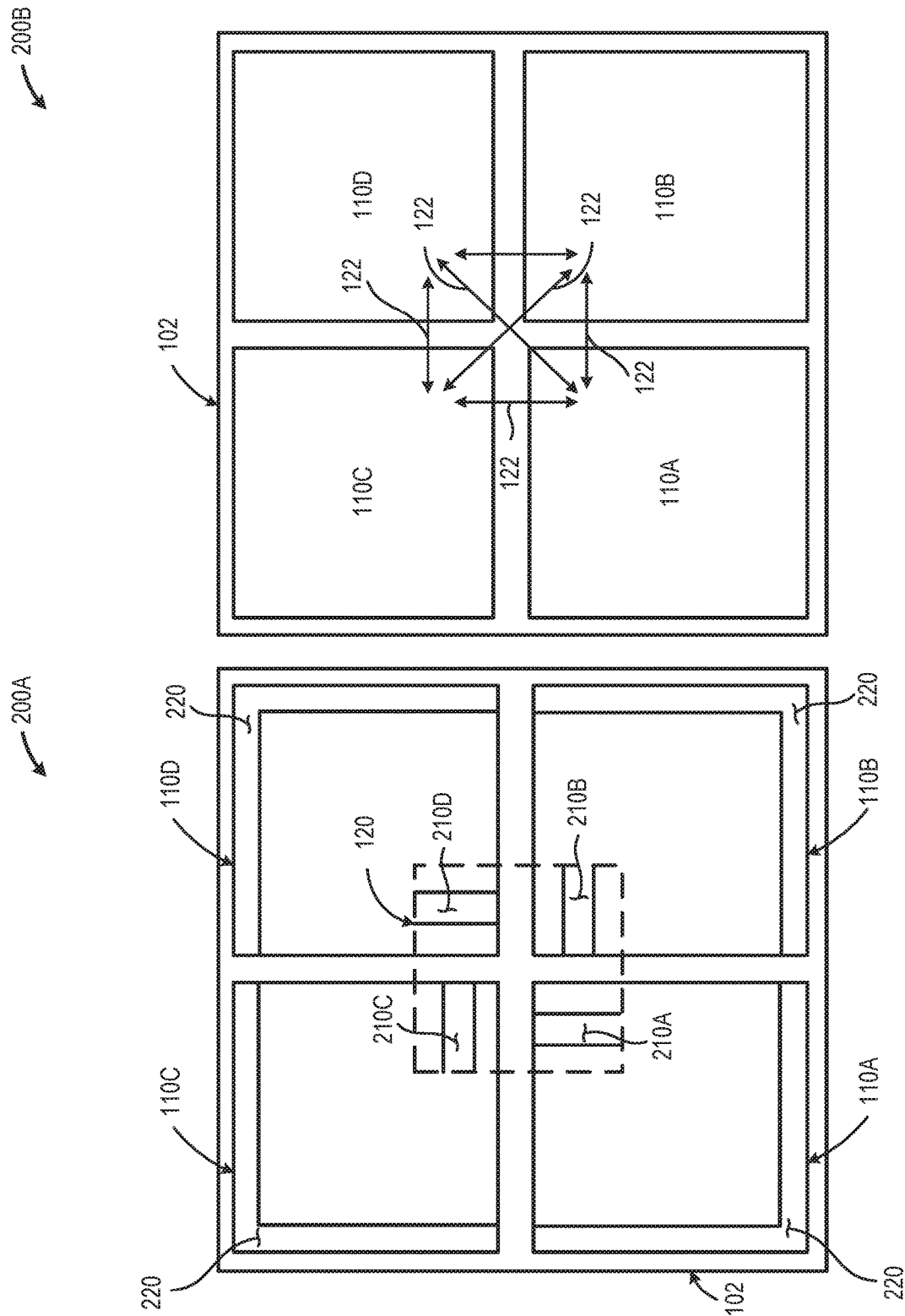

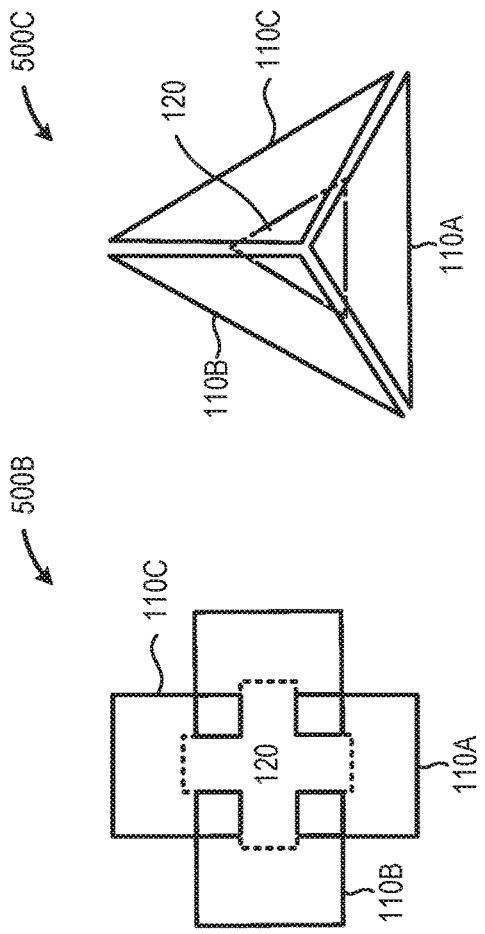
FIG. 5A
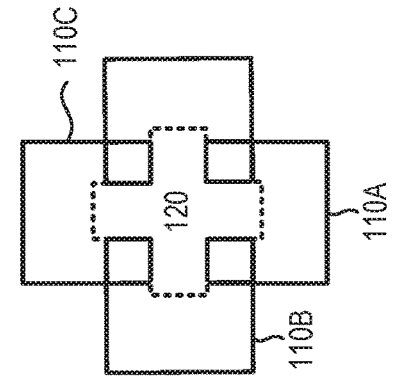
FIG. 5B
FIG. 5C
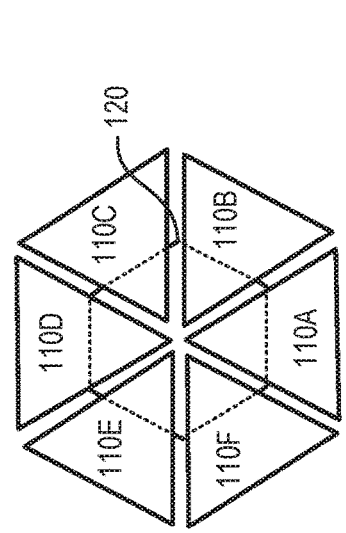
FIG. 5D
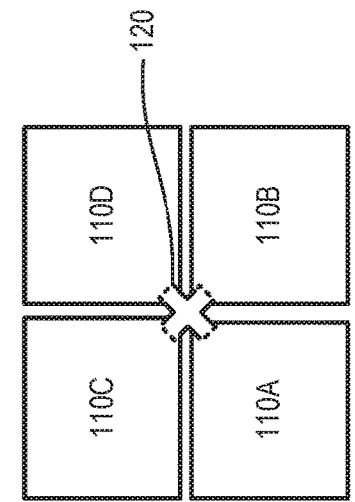
FIG. 5E

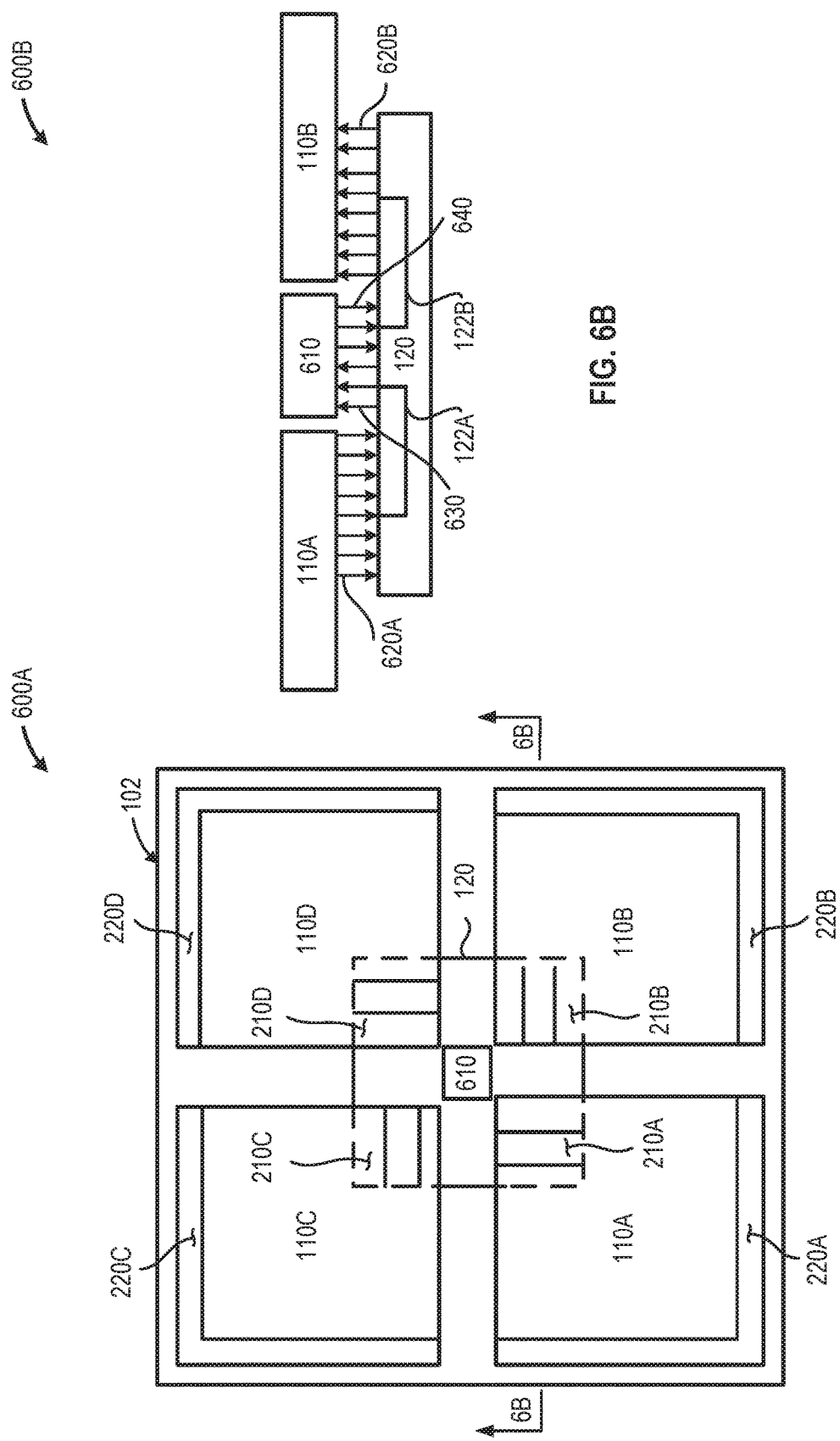

BRIDGE HUB TILING ARCHITECTURE

TECHNICAL FIELD

The present disclosure relates to semiconductor packaging.

BACKGROUND

Next-generation data centers are trending toward systems providing greater computational capabilities, operational flexibility, and improved power efficiency. The combination of demands presented by next-generation data centers present significant challenges for current general-purpose servers. Increasing demand for reduced system complexity and business agility and scalability has increased demand for virtualized data center infrastructure will place additional demands on next-generation data servers. To meet such varied requirements, next-generation servers may be designed to address a specific workload matrix. However, such task- or service-oriented design, while improving power efficiency, compromises the long term flexibility of such next-generation servers. Thus, the servers used in next-generation data centers must be capable of providing a cost effective solution that addresses current and future computational demands, provides a flexible platform capable of meeting evolving operational needs, while delivering improved power efficiency over legacy servers. The challenges presented by the growing ubiquity of Internet-of-Things (IoT) devices are surprisingly similar to those presented by next-generation data centers. With literally billions of connected devices, cloud-based infrastructure must quickly evaluate high-bandwidth data streams and determine which data may be processed and which data may be safely dropped.

Next-generation platforms share several distinct requirements: increased bandwidth; increased flexibility to promote increased functionality; improved power efficiency (or reduced power consumption) and reduced footprint requirements. Heretofore, designers may address such varied demands by packing additional components on a standard printed circuit board. The limitations inherent in such single board solutions may not satisfactorily address the multiple demands placed on next-generation devices. Such limitations include: chip-to-chip bandwidth limitations based on interconnect density; the power demand of long distance traces between chips; and the increased physical size of printed circuit boards to accommodate the chips. Monolithic integration of system components provides a potential solution, however such integration does not readily permit the integration of system components, each of which may evolve at different rates. For example, a logic chip built using a newer technology may not easily integrate or lend itself to monolithic fabrication with a memory chip built using an older technology.

Conventional solutions are therefore unable to meet future demands of higher bandwidth, greater power efficiency, increased functionality, and increased operational flexibility—all in a physically smaller package.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIG. 2A is a plan view of an illustrative semiconductor package 200 that includes four semiconductor dies, each having a respective PHY layer transceiver conductively coupled to a single, centrally located, multi-die interconnect bridge, in accordance with at least one embodiment described herein;

FIG. 2B is a schematic view of the communication pathways provided by the single, centrally located, multi-die interconnect bridge as depicted in FIG. 2A, in accordance with at least one embodiment described herein;

FIG. 5A is a plan view of an illustrative semiconductor package having a first non-conventional configuration that includes three rectangular semiconductor dies conductively coupled to a single, triangular, multi-die interconnect bridge, in accordance with at least one embodiment described herein;

FIG. 5B is a plan view of an illustrative semiconductor package having a second non-conventional configuration that includes four rectangular semiconductor dies conductively coupled to a single, cruciform, multi-die interconnect bridge, in accordance with at least one embodiment described herein;

FIG. 5C is a plan view of an illustrative semiconductor package having a third non-conventional configuration that includes three triangular semiconductor dies conductively coupled to a single, triangular, multi-die interconnect bridge, in accordance with at least one embodiment described herein;

FIG. 5D is a plan view of an illustrative semiconductor package having a fourth non-conventional configuration that includes six triangular semiconductor dies conductively coupled to a single hexagonal multi-die interconnect bridge, in accordance with at least one embodiment described herein;

FIG. 5E is a plan view of an illustrative semiconductor package having a fifth non-conventional configuration that includes four semiconductor dies conductively coupled to a single cruciform multi-die interconnect bridge, in accordance with at least one embodiment described herein;

FIG. 6A is a plan view of an illustrative system that includes a semiconductor package in which a single multi-die interconnect bridge that includes an active die conductively couples four semiconductor dies, in accordance with at least one embodiment described herein;

FIG. 6B is a cross sectional elevation of the illustrative semiconductor package depicted in FIG. 6A along section line 6B-6B, in accordance with at least one embodiment described herein;

Figure 1A:
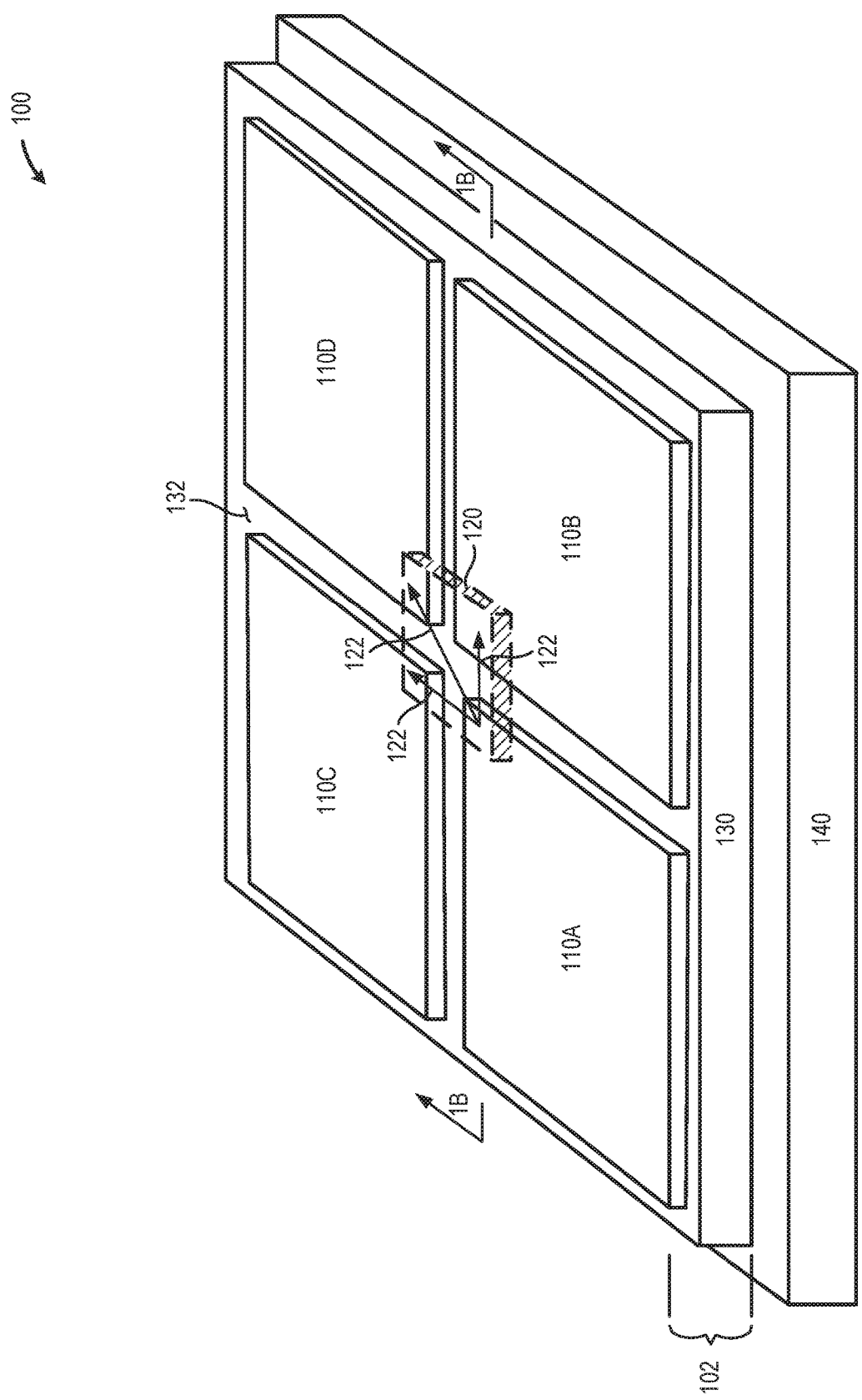
FIG. 1A is a schematic of an illustrative system that includes at least three semiconductor dies each of the semiconductor dies conductively coupled to the remaining semiconductor dies using an multi-die interconnect bridge at least partially disposed in the semiconductor package substrate, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods described herein facilitate the coupling of various semiconductor dies ("chiplets") within a semiconductor package using a multi-die interconnect bridge disposed in the surface of the semiconductor package substrate and communicably couples three or more semiconductor dies such that each of the three or more semiconductor dies is conductively coupled to each of the remaining three or more semiconductor dies and the conductive coupling between any two of the at least three semiconductor dies does not pass through any other semiconductor die included in the at least three semiconductor dies. The multi-die interconnect bridge may be formed as a separate silicon die that is at least partially embedded in the semiconductor package substrate during the package fabrication process. The multi-die interconnect bridge may be formed integral with the semiconductor package substrate during the substrate fabrication process. Each of the at least three semiconductor dies conductively coupled to the multi-die interconnect bridge may occupy the same or differing physical areas on the surface of the semiconductor package substrate. The multi-die interconnect bridge may occupy a physical area of the surface of the semiconductor package substrate that is less than the physically smallest of the at least three semiconductor dies.

The use of multi-die interconnect bridges to conductively couple at least three semiconductor dies occupy a minimal footprint on the semiconductor package substrate, permitting greater density and consequently a reduced package footprint. Physical proximity of the constituent semiconductor dies coupled to the bridge shortens the interconnect length, beneficially improving bandwidth and power efficiency. The use of multi-die interconnect bridges to conductively couple at least three semiconductor dies does not require the use of through silicon vias (TSVs), beneficially improving signal quality and bandwidth when compared to traditional silicon interposer layers. The use of multi-die interconnect bridges to conductively couple at least three semiconductor dies permits the selective use of fine-pitch micro-bumps for high density communications and coarser-pitch flip-chip bumps for power and ground connections.

The multi-die interconnect bridge may include only conductors to directly couple each of the at least three semiconductor dies to the remaining at least three semiconductor dies. The multi-die interconnect bridge may include one or more active elements, such as control circuitry and/or repeater circuitry between one or more of the at least three semiconductor dies and the remaining at least three semiconductor dies.

The use of an multi-die interconnect bridge also decouples each of the at least three semiconductor dies, permitting the use of mixed architecture dies in a single package—something that is not possible using monolithic manufacturing techniques. For example, the use of an multi-die interconnect bridge permits the operable and conductive coupling of a logic chip manufactured using 14 nanometer (nm) technology to a memory chip manufactured using 40 nm technology and a graphics processing unit (GPU) manufactured using 28 nm technology. Thus, individual semiconductor die components may be mixed and matched as needed to provide a flexible system architecture that meets energy and performance criteria.

When compared to physically larger silicon interposers, the smaller multi-die interconnect bridge is generally less expensive and less prone to manufacturing issues such as warpage. Further, for each signal that connects to a ball coupled to the semiconductor package substrate, a silicon interposer requires a corresponding through silicon via (TSV). Such TSVs add to package manufacturing complexity. The increase in manufacturing complexity increased incremental yield loss, adversely impacting overall commercial viability. Additionally, the use of a large number of TSVs results in poor signal integrity for high-speed signals and causes IR drop for power delivery nets. TSVs also add series resistance and capacitance which impair high speed design for transceiver blocks on the semiconductor dies.

A semiconductor package is provided. The semiconductor package may include: a semiconductor package substrate having a first surface and a transversely opposed second surface separated by a thickness; at least three semiconductor dies coupled to the semiconductor package substrate; where a smallest of the at least three semiconductor dies occupies a first physical area on the first surface of the semiconductor package substrate; and a multi-die interconnect bridge that includes one or more conductive members disposed proximate the first surface of the semiconductor package substrate and occupying a second physical area of the first surface of the semiconductor package substrate; wherein the multi-die interconnect bridge conductively couples each of the at least three semiconductor dies to each of the remaining at least three semiconductor dies; and wherein the second physical area occupied by the multi-die interconnect bridge is less than the first physical area of a smallest of the at least three semiconductor dies.

A semiconductor package fabrication method is provided. The method may include: disposing a multi-die interconnect bridge that includes a plurality of conductive members proximate a first surface of a semiconductor package substrate, the multi-die interconnect bridge occupying a first physical area of the first surface of the semiconductor package substrate; and conductively coupling each of at least three semiconductor dies to the multi-die interconnect bridge such that the plurality of conductive members conductively couples each of the at least three semiconductor dies to the remaining at least three semiconductor dies; where a smallest of the at least three semiconductor dies occupies a second physical area on the first surface of the semiconductor package substrate; and where the first physical area occupied by the multi-die interconnect bridge is less than the second physical area of a smallest of the at least three semiconductor dies.

A semiconductor package fabrication system is provided. The semiconductor package fabrication system may include: means for disposing a multi-die interconnect bridge that includes a plurality of conductive members proximate a first surface of a semiconductor package substrate, the multi-die interconnect bridge occupying a first physical area of the first surface of the semiconductor package substrate; and means for conductively coupling each of at least three semiconductor dies to the multi-die interconnect bridge such that the plurality of conductive members conductively couples each of the at least three semiconductor dies to the remaining at least three semiconductor dies; where a smallest of the at least three semiconductor dies occupies a second physical area on the first surface of the semiconductor package substrate; and where the first physical area occupied by the multi-die interconnect bridge is less than the second physical area of a smallest of the at least three semiconductor dies.

An electronic device that includes a semiconductor package having at least one multi-die interconnect bridge is provided. The electronic device may include: a printed circuit board; a semiconductor package conductively coupled to the printed circuit board, the semiconductor package including: a semiconductor package substrate coupled to the printed circuit board, the semiconductor package substrate having a first surface and a transversely opposed second surface separated by a thickness; at least three semiconductor dies included in the semiconductor package and coupled to the first surface of the semiconductor package substrate; where a smallest of the at least three semiconductor dies occupies a first physical area on the first surface of the semiconductor package substrate; and a multi-die interconnect bridge disposed proximate the first surface of the semiconductor package substrate, the multi-die interconnect bridge including one or more conductive members and occupying a second physical area of the first surface of the semiconductor package substrate; where the multi-die interconnect bridge conductively couples each of the at least three semiconductor dies to each of the remaining at least three semiconductor dies; and where the second physical area occupied by the multi-die interconnect bridge is less than the first physical area of a smallest of the at least three semiconductor dies.

As used herein the terms "top," "bottom," "upper," "lower," "lowermost," and "uppermost" when used in relationship to one or more elements are intended to convey a relative rather than absolute physical configuration. Thus, an element described as an "upper film layer" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in a number of additional databases, each having an identified relationship to the accessed element. In another example, if "A" is logically associated with "B," accessing "A" will expose or otherwise draw information and/or data from "B," and vice-versa.

Figure 1B:
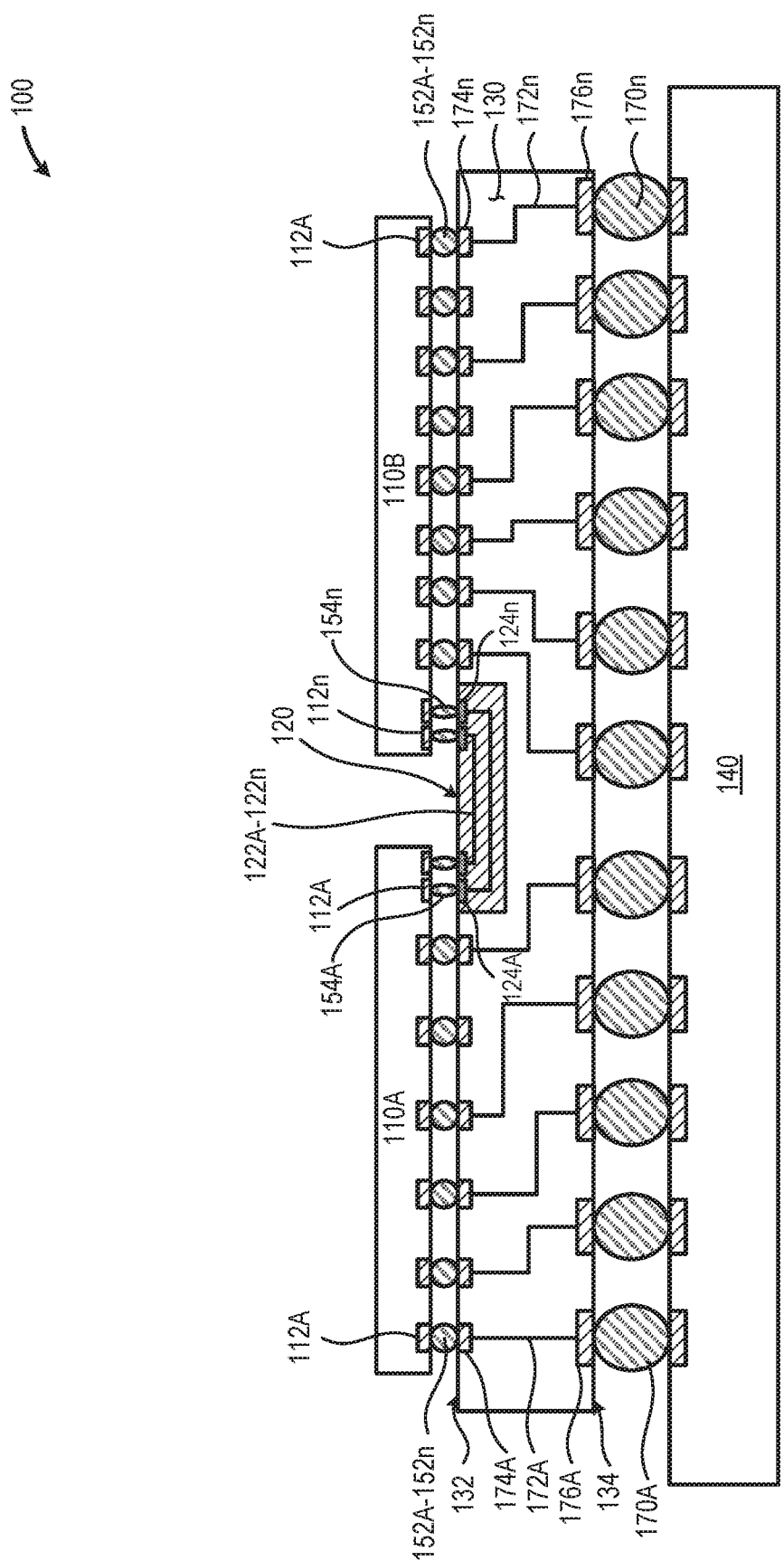
FIG. 1B is a cross-sectional elevation of the illustrative system depicted in FIG. 1A along section line 1B-1B, in accordance with at least one embodiment described herein.

FIG. 1A is a schematic of an illustrative system 100 that includes at least three semiconductor dies 110A-110D (collectively, "semiconductor dies 110") each of the semiconductor dies conductively coupled to the remaining semiconductor dies using an multi-die interconnect bridge 120 at least partially disposed in the semiconductor package substrate 130, in accordance with at least one embodiment described herein. FIG. 1B is a cross-sectional elevation of the illustrative system 100 depicted in FIG. 1A along section line 1B-1B, in accordance with at least one embodiment described herein. In embodiments, the semiconductor package 102 may be conductively coupled to a substrate 140, such as a circuit board or similar. In embodiments, the multi-die interconnect bridge 120 may include a silicon die that fabricated separate from the semiconductor package substrate 130 and is at least partially embedded in a first surface 132 of the semiconductor package substrate 130. In other embodiments, the multi-die interconnect bridge 120 may be fabricated integral with the semiconductor package substrate 130.

The multi-die interconnect bridge 120 provides a bidirectional communication path 122A-122n (collectively, "communication paths 122") between each of the at least three semiconductor dies 110 and some or all of the remaining at least three semiconductor dies 110. Beneficially, the bidirectional communication paths 122 between any semiconductor dies 110 conductively coupled to the multi-die interconnect bridge 120 occurs without passing through any intervening dies included in the at least three semiconductor dies 110. In embodiments, the multi-die interconnect bridge 120 defines the shortest communication path 122 between any two of the at least three semiconductor dies 110. By providing the shortest, direct, communications path 122 between each of the at least three semiconductor dies 110 coupled to the multi-die interconnect bridge 120, power loss is reduced, power efficiency is increased, and communication bandwidth is maximized.

The semiconductor dies 110 may include any number, combination, and/or type of currently available and/or future developed dies. Example semiconductor dies 110 include, but are not limited to one or more: central processing units (CPUs); application specific integrated circuits (ASICs); field programmable gate arrays (FPGAs); transceivers; flash memories; dynamic random access memories (DRAMs); and similar. In embodiments, the semiconductor dies 110 may form a system-in-package (SiP) semiconductor package 102. In embodiments, the semiconductor dies 110 disposed on the semiconductor package substrate 130 may integrate chiplets or semiconductor dies 110 from different process nodes in a single package. For example, in contrast to monolithic semiconductor package architecture, the systems and methods described herein permit the integration of semiconductor dies 110 having differing architectures (14 nanometer, 20 nanometer, 28 nanometer, and 40 nanometer, etc.) in a single semiconductor package 102.

The ability to quickly and efficiently change the semiconductor dies 110 included in a semiconductor package 102 beneficially improves manufacturing flexibility and market responsiveness. For example, a semiconductor package 102 manufactured for a first customer may include one or more Peripheral Component Interconnect Express (PCIe) Gen 3 transceivers while a second customer requires the same semiconductor package 102 with a one or more semiconductor dies 110 optical and/or Pulse Amplitude Modulated (e.g., PAM-4) transceivers. Since semiconductor dies 110 may be readily substituted without requiring a complete rework of the semiconductor package 102, time-to-market is reduced and market responsiveness beneficially improved. Similarly, incremental improvements in technology (e.g., 3G to 4G to 5G improvements in cellular communications technology) may be readily incorporated into a semiconductor package 102 without requiring a costly and time-consuming redesign of the entire package.

Each of the at least three semiconductor dies 110 includes any number of contact elements 112A-112n (lands, pads, grooves, pins, sockets, etc.—collectively "contact elements 112") disposed in, on, about, or across at least a portion of the lower surface of the semiconductor die 110. In embodiments, the semiconductor dies 110 may communicably couple to the multi-die interconnect bridge 120 using relatively small conductive structures 154A-154n (collectively, "conductive structures 154"), such as micro-bumps compatible with a fine-pitch and/or high-density connection configuration. In some embodiments, such high-density connections may be used for inter-die communication between some or all of the at least three semiconductor dies 110 coupled to the multi-die interconnect bridge 120. In embodiments, the semiconductor dies 110 may communicably couple to the multi-die interconnect bridge 120 using relatively large conductive structures 152A-152n (collectively, "conductive structures 152"), such as solder ball compatible with a relatively coarse-pitch and/or relatively low density connection configuration. In such embodiments, low-density connections may be useful as inter-die power distribution and/or grounding between some or all of the at least three semiconductor dies 110 coupled to the multi-die interconnect bridge 120.

In embodiments, some or all of the at least three semiconductor dies 110 may be manufactured using a flip-chip manufacturing technique in which circuitry is formed in each die on a wafer, metallized pads are formed on the wafer, conductive structures 152 and/or conductive structures 154 are deposited, patterned, positioned, or otherwise formed on the metallized pads, and the wafer is singulated to form semiconductor dies 110. The singulated semiconductor dies 110 are positioned on the semiconductor package substrate 102 and/or the multi-die interconnect bridge 120 and the conductive structures 152 and/or conductive structures 154 reflowed to physically attach and conductively bond the at least three semiconductor dies 110 to the multi-die interconnect bridge 120 and to the semiconductor package substrate 102.

The use of a central multi-die interconnect bridge 120 to conductively couple the at least three semiconductor dies 110 may reduce the number of transceivers patterned or otherwise formed in, on, or about each of the at least three semiconductor dies 110. For example, in a conventional layout, an multi-die interconnect bridge is used to connect two die-to-die transceivers patterned or otherwise formed in adjacent semiconductor dies. Thus, a square semiconductor die surrounded by four other semiconductor dies (one on each side) may require up to four (4) different die-to-die transceivers, one for each multi-die interconnect bridge. The systems and methods described herein reduce the required number of transceivers on each of the to one, freeing the die area previously occupied by three (3) additional die-to-die transceivers. In embodiments, each of the at least three semiconductor dies 110 occupy a defined area on an upper or first surface 132 of the semiconductor package substrate 130. Each of the at least three semiconductor dies 110 may occupy the same or differing areas on the first surface 132 of the semiconductor package substrate 130. At least one of the at least three semiconductor dies 110 may occupy less surface area on the first surface 132 of the semiconductor package substrate 130 than the remaining at least three semiconductor dies 110. Thus, the at least one of the at least three semiconductor dies 110 occupying the least surface area of the first surface 132 of the semiconductor package substrate may be considered the "smallest" of the at least three semiconductor dies 110.

The multi-die interconnect bridge 120 conductively couples each of the at least three semiconductor dies 110 to each of the remaining at least three semiconductor dies using contact elements 124A-124n (lands, pads, grooves, pins, sockets, etc.—collectively, "contact elements 124") disposed in, on, about, or across at least a portion of an upper surface of the multi-die interconnect bridge 120. In embodiments, the multi-die interconnect bridge 120 may be fabricated as a silicon die that is at least partially deposited, sunken, or otherwise embedded into the first surface 132 of the semiconductor package substrate 130 during substrate fabrication. In other embodiments, the multi-die interconnect bridge 120 may be integrally fabricated in the first surface 132 of the semiconductor package substrate 120. In yet other embodiments, the multi-die interconnect bridge 120 may include a silicon member that is electrically isolated from the semiconductor package substrate 130 and disposed proximate the first surface 132 of the semiconductor package substrate 130.

The multi-die interconnect bridge 120 may include any number of conductive members (traces, elements, wires, conductors, etc.) that provide any number of communications paths 122A-122n between at least some of the at least three semiconductor dies 110A-110n. The conductive members forming the communications paths 122 may be formed, patterned, deposited or otherwise arranged in any number of layers or similar structures. Further, the multi-die interconnect bridge 120 includes any number and/or combination of contact elements 124A-124n (lands, pads, grooves, sockets, etc.—collectively, "contact elements 124") that conductively couple to the at least three semiconductor dies 110. The multi-die interconnect bridge 120 may have any physical geometry, size, and/or shape suitable for physical and conductive coupling to the at least three semiconductor dies 110. For example, the multi-die interconnect bridge 120 may have a square, rectangular, triangular, circular, oval, or multi-sided polygonal configuration. As depicted in FIGS. 1A and 1B, the multi-die interconnect bridge 120 includes a number of relatively short communication paths 122 that conductively couples semiconductor die 110A with each of some or all of the remaining semiconductor dies 110B-110D. In embodiments, the communication paths 122 may define the shortest distance between any two of the at least three semiconductor dies 110.

The multi-die interconnect bridge 120 facilitates heterogeneous in-package integration by connecting the at least three semiconductor dies 110 using an ultra-high density interconnect to conductively couple the at least three semiconductor dies 110. The multi-die interconnect bridge 120 enables the integration, placement, or positioning of the contact elements 112 near the edges of the at least three semiconductor dies 110 due to the overall reduction in input/output (I/O). This geometry facilitates precise physical coupling of the at least three semiconductor dies 110 and results in the shortest possible communication paths 122 between the at least three semiconductor dies 110. The shortened communication paths 122 result in reduced loading on the driving buffer, improving performance relative to other solutions such as silicon interposers where greatly increased communication path lengths increase loading on the driving buffer, hindering performance.

In embodiments, the multi-die interconnect bridge 120 may include any number and/or combination of contact elements (lands, pads, grooves, sockets, etc.) to accept the insertion of one or more active elements (not depicted in FIGS. 1A and 1B). In embodiments, such active elements may be disposed such that communication between any one of the at least three semiconductor dies and any other of the at least three semiconductor dies coupled to the multi-die interconnect bridge 120 passes through the active element. In other embodiments, such active elements may be disposed such that communication between selected ones of the at least three semiconductor dies 110 pass through the active element while communication between the remaining at least three semiconductor dies 110 does not pass through the active element. Example active elements include, but are not limited to, silicon dies that include: control circuitry and/or repeater circuitry.

The multi-die interconnect bridge 120 may be fabricated using one or more dielectric or electrically insulative materials. In some embodiments, the multi-die interconnect bridge 120 may be fabricated as a silicon die. In some embodiments, the multi-die interconnect bridge 120 may be fabricated as a structure or member containing one or more conductive layers and one or more dielectric layers. In some embodiments, the communication paths 122 through the multi-die interconnect bridge 120 may include a number of patterned traces deposited using any currently available or future developed patterning and/or deposition process. The conductive elements 122 forming the communication paths 122 may include one or more metallic or non-metallic electrically conductive materials. Example electrically conductive materials include, but are not limited to: copper; alloys or compounds containing copper; aluminum; alloys or compounds containing aluminum; conductive polymers, and similar.

In embodiments, the area of the first surface 132 of the semiconductor package substrate 130 occupied by the multi-die interconnect bridge 120 is less than the area of the first surface 132 of the semiconductor package substrate 130 occupied by the smallest of the at least three semiconductor dies 110. Thus, unlike conventional silicon interposers, the multi-die interconnect bridge 120 is less prone to quality issues such as warpage and does not require the use of through silicon vias, simplifying the manufacturing process and reducing overall manufacturing complexity.

The at least three semiconductor dies 110 conductively couple to contact elements 174A-174n (lands, pads, groves, pins, sockets, etc.—collectively, "contact elements 174") disposed in, on, about, or across all or a portion of the first surface 132 of the semiconductor package substrate 130. Conductive elements 172A-172n conductively couple the contact elements 174 on the first surface 132 of the semiconductor package substrate 130 to contact elements 176A-176n (lands, pads, groves, pins, sockets, etc.—collectively, "contact elements 176") disposed in, on, about, or across all or a portion of a lower or second surface 134 of the semiconductor package substrate 130. The first surface 132 and the second surface 134 are transversely opposed across the thickness of the semiconductor package substrate 130.

In embodiments, the multi-die interconnect bridge 120 may include a semiconductor die or similar pre-fabricated structure that is disposed, positioned, placed, or otherwise affixed to the semiconductor package substrate 130 such that the upper surface of the multi-die interconnect bridge 120 is parallel to the first surface 132 of the semiconductor package substrate 130. In embodiments, the upper surface of the multi-die interconnect bridge 120 may be co-planar with the first surface 132 of the semiconductor package substrate 130. In other embodiments, the upper surface of the multi-die interconnect bridge 120 may project from or be recessed into the first surface 132 of the semiconductor package substrate 130. In other embodiments, the multi-die interconnect bridge 120 may include one or more structures (conductors, vias, etc.) that are formed integral with the semiconductor package substrate 130. In such embodiments, the upper surface of the multi-die interconnect bridge 120 may be coplanar with the first surface 132 of the semiconductor package substrate 130. In some embodiments, the multi-die interconnect bridge 120 may conductively couple to one or more circuits and/or conductive elements 172 disposed in the semiconductor package substrate 130. In some embodiments, the multi-die interconnect bridge 120 may conductively couple to one or more of the contact elements 174 disposed on the upper surface 132 of the semiconductor package substrate 130 and/or contact elements 176 disposed on the lower surface 134 of the semiconductor package substrate 130.

The semiconductor package substrate 130 may include any number and/or combination of electronic components, semiconductor devices, and/or logic elements formed into one or more circuits. In some embodiments, the semiconductor package substrate 130 may include any number of interleaved patterned conductive and dielectric layers. Any number of conductive structures 170A-170n (solder balls, solder bumps, clips, wires, etc.—collectively, "conductive structures 170") may physically affix and/or conductively couple the semiconductor package substrate to an underlying substrate 140, such as a printed circuit board, motherboard, daughterboard, or similar. In at least some embodiments, the substrate 140 may form all or a portion of a processor-based electronic device, such as a portable electronic device or smartphone.

FIG. 2A is a plan view of an illustrative semiconductor package 200 that includes four semiconductor dies 110A-110D, each having a respective PHY layer transceiver 210A-210D (collectively, "transceivers 210") conductively coupled to a single, centrally located, multi-die interconnect bridge 120, in accordance with at least one embodiment described herein. FIG. 2B is a schematic view of the communication pathways provided by the single, centrally located, multi-die interconnect bridge 120 as depicted in FIG. 2A, in accordance with at least one embodiment described herein. As depicted in FIGS. 2A and 2B, using only a single PHY layer transceiver 210 on each of the semiconductor dies 110, direct bidirectional communication paths 122A-122F exist between a single semiconductor die 110A and the remaining semiconductor dies 110B-110D.

In embodiments, the multi-die interconnect bridge 120 permits direct, bidirectional, communication between any two of the semiconductor dies 110A-110D using only a single transceiver 210 on each die. Such represents a significant reduction in die surface area dedicated to transceivers 210 over prior designs where each communication path 122 between two semiconductor dies 110 required a separate transceiver on each die. Thus, instead of a single transceiver as depicted in FIG. 2A, in a traditional multi-die semiconductor package arrangement, semiconductor die 110A would have a first transceiver to conductively couple to semiconductor die 110B and a second transceiver to conductively couple to semiconductor die 110C. The input/output contacts may be disposed in a peripheral area 220A-220D of each of the semiconductor dies 110A-110D.

Figure 3:
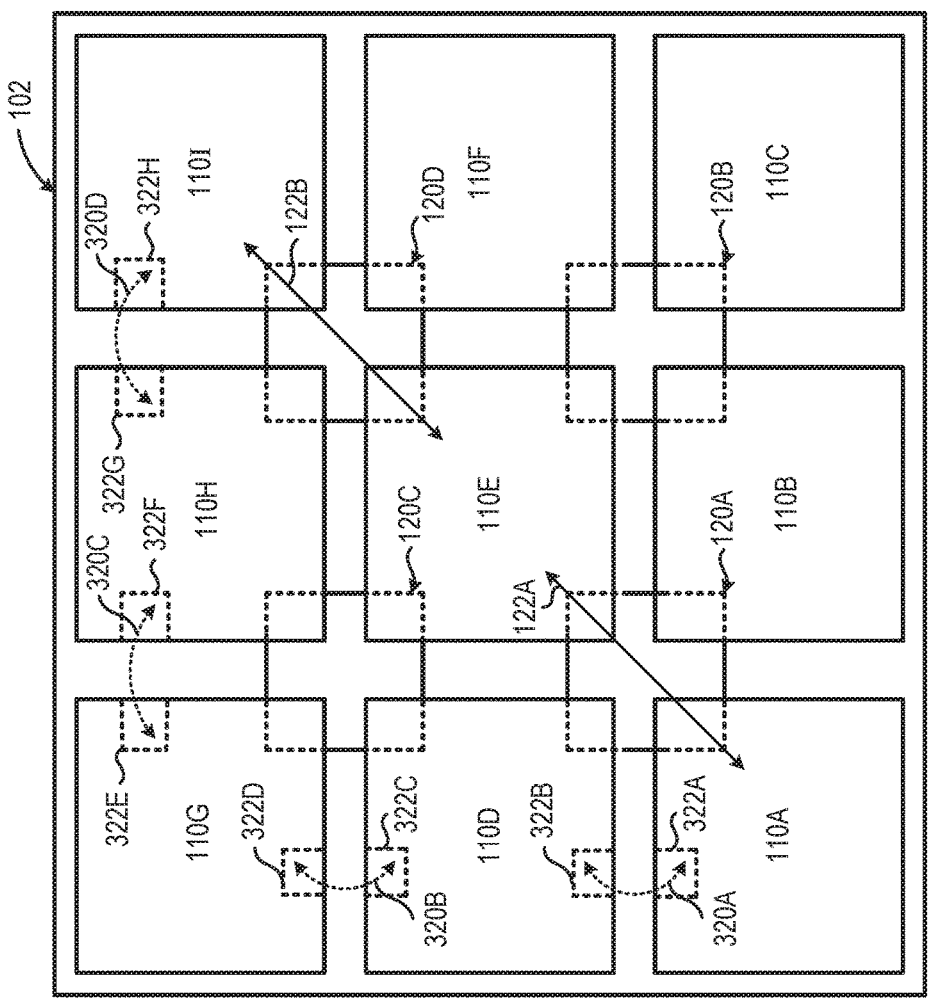
FIG. 3 is a plan view of a system that includes a semiconductor package in which a total of nine semiconductor dies are communicably coupled together using only four multi-die interconnect bridges, in accordance with at least one embodiment described herein.

FIG. 3 is a plan view of a system 300 that includes a semiconductor package 102 in which a total of nine semiconductor dies 110A-110I are communicably coupled together using only four multi-die interconnect bridges 120A-120D, in accordance with at least one embodiment described herein. As depicted in FIG. 3, each of the multi-die interconnect bridges 120A-120D conductively couples to four different semiconductor dies 110. Thus, communication between any two of the nine semiconductor dies 110 requires, at most, communication through only a single intervening semiconductor die 110.

Using the configuration depicted in FIG. 3, the systems and methods described herein provide communication between diagonally opposed dies 110A and 110I using communication paths 122A and 122B that traverse only two multi-die interconnect bridges 120A and 120D and a single intervening semiconductor die 110E. Under more conventional bridging architecture (shown as dashed lines in FIG. 3), interconnect bridges only conductively couple laterally (not diagonally) adjacent semiconductor dies 110. Such an arrangement or architecture would require communication paths 320A, 320B, 320C, and 320D pass through a total of eight (8) transceivers 322A-322H and cross three intervening semiconductor dies, 110D, 110G, 110H. Thus, when compared to traditional bridges that conductively couple semiconductor dies only laterally (as opposed to the current systems and methods that conductively couple semiconductor dies laterally AND diagonally), the systems and methods described herein reduce power consumption, reduce latency, increase available semiconductor die area, and improve performance while addressing a significant issue facing communication and performance in multi-die semiconductor packages.

Figure 4:
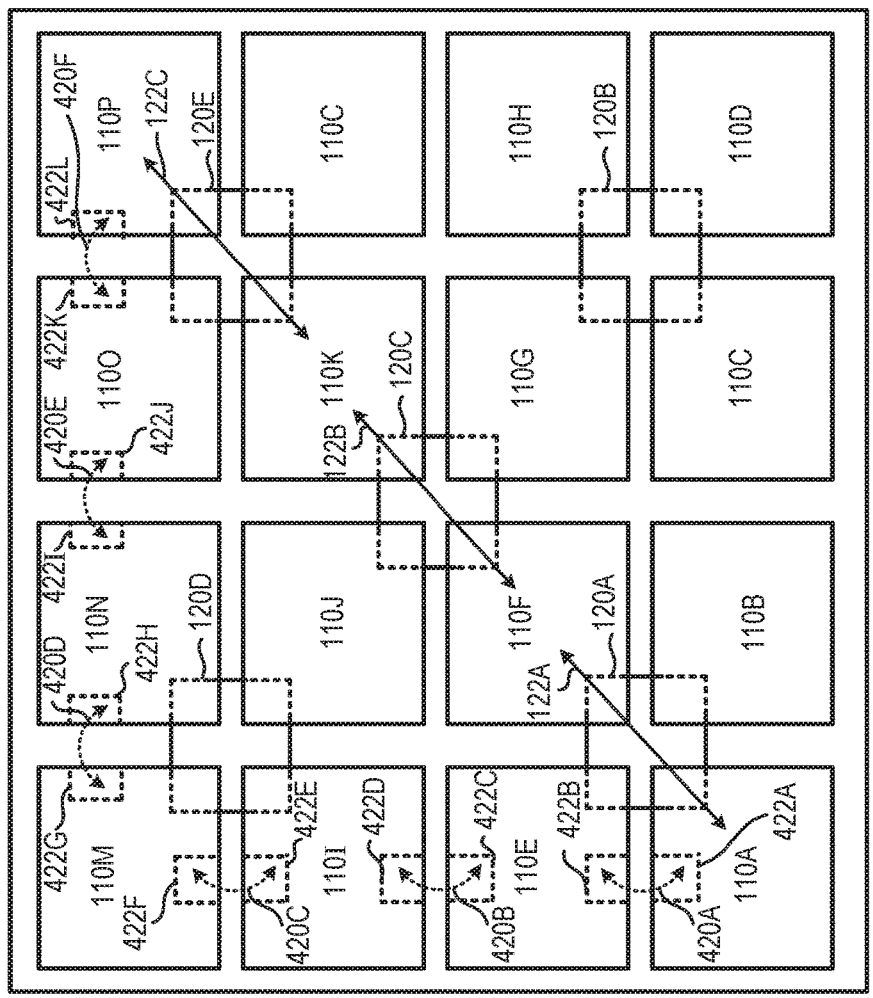
FIG. 4 is a plan view of a system that includes a semiconductor package in which a total of sixteen semiconductor dies are communicably coupled together using only five multi-die interconnect bridges, in accordance with at least one embodiment described herein.

FIG. 4 is a plan view of a system 400 that includes a semiconductor package 102 in which a total of sixteen semiconductor dies 110A-110P are communicably coupled together using only five multi-die interconnect bridges 120A-120E, in accordance with at least one embodiment described herein. As depicted in FIG. 4, each of the multi-die interconnect bridges 120A-120E conductively couples to four different semiconductor dies 110. Thus, communication between any two of the sixteen semiconductor dies 110 requires, at most, communication through only two intervening semiconductor dies 110.

For example, using the configuration depicted in FIG. 4, the systems and methods described herein provide communication between diagonally opposed dies 110A and 110P using communication paths 122A, 122B, and 122C that traverse three multi-die interconnect bridges (120A, 120C and 120E) across two intervening semiconductor dies (110F and 110K). Under more conventional bridging architecture (shown as dashed lines in FIG. 4), interconnect bridges only conductively couple laterally (not diagonally) adjacent semiconductor dies 110. Such an arrangement or architecture would require six communication paths 420A-420F and pass through a total of twelve transceivers 422A-422L and cross five intervening semiconductor dies (110E, 110I, 110M, 110N, and 110O). Thus, when compared to traditional bridges that conductively couple semiconductor dies only laterally (as opposed to the current systems and methods that conductively couple semiconductor dies laterally AND diagonally), the systems and methods described herein reduce power consumption, reduce latency, increase available semiconductor die area, and improve performance while addressing a significant issue facing communication and performance in multi-die semiconductor packages.

FIG. 5A is a plan view of an illustrative semiconductor package 500A having a first non-conventional configuration that includes three rectangular semiconductor dies 110A-110C conductively coupled to a single, triangular, multi-die interconnect bridge 120, in accordance with at least one embodiment described herein.

FIG. 5B is a plan view of an illustrative semiconductor package 500B having a second non-conventional configuration that includes four rectangular semiconductor dies 110A-110C conductively coupled to a single, cruciform, multi-die interconnect bridge 120, in accordance with at least one embodiment described herein.

FIG. 5C is a plan view of an illustrative semiconductor package 500C having a third non-conventional configuration that includes three triangular semiconductor dies 110A-110C conductively coupled to a single, triangular, multi-die interconnect bridge 120, in accordance with at least one embodiment described herein.

FIG. 5D is a plan view of an illustrative semiconductor package 500D having a fourth non-conventional configuration that includes six triangular semiconductor dies 110A-110F conductively coupled to a single hexagonal multi-die interconnect bridge 120, in accordance with at least one embodiment described herein.

FIG. 5E is a plan view of an illustrative semiconductor package 500E having a fifth non-conventional configuration that includes four semiconductor dies 110A-110D conductively coupled to a single cruciform multi-die interconnect bridge 120, in accordance with at least one embodiment described herein.

As depicted by the illustrative semiconductor package configurations in FIGS. 5A-5E, the systems and methods described herein are not limited to conventional geometries and are adaptable to a variety of semiconductor die shapes, sizes, and configurations. Similarly, the multi-die interconnect bridge 120 may have any shape, size, or physical geometry that provides sufficient overlap with each of the semiconductor dies 110 to permit the attachment of the semiconductor dies 110 to the multi-die interconnect bridge 120 via the conductive structures 154.

FIG. 6A is a plan view of an illustrative system 600 that includes a semiconductor package 102 in which a single multi-die interconnect bridge 120 that includes an active die 610 conductively couples four semiconductor dies 110A-110D, in accordance with at least one embodiment described herein. FIG. 6B is a cross sectional elevation of the illustrative semiconductor package 102 depicted in FIG. 6A along section line 6B-6B, in accordance with at least one embodiment described herein. In embodiments, the multi-die interconnect bridge 120 may include a passive electronic element. Passive electronic elements include, but are not limited to, passive electrical components, such as conductors, resistors, inductors, capacitors, and similar. One or more active elements, such as an active die 610, may be conductively coupled to the multi-die interconnect bridge 120. Such active dies 610 may include circuitry such as controller circuitry, repeater circuitry, filter circuitry, amplification circuitry, and similar. Power for the active die 610 may be supplied by one or more semiconductor dies 110 via the multi-die interconnect bridge 120.

In at least some embodiments, one or more signals 620A may be supplied by a first semiconductor die 110A to the multi-die interconnect bridge 120. All or a portion of the signal may be provided as an input signal 630 to the active die 610. The active die 610 may provide an output signal 640 to the multi-die interconnect bridge 120. The signal 620B may then be provided, via the multi-die interconnect bridge 120, to a second semiconductor die 110B. For example, the first semiconductor die 110A may generate a signal 620A that is provided to the multi-die interconnect bridge 120. One or more filters, that includes any number and/or combination of passive elements such as resistors, capacitors, and/or inductors (LC-filter, RC-filter, RL-filter, RLC-filter, etc.) may be formed in the multi-die interconnect bridge 120. The filtered signal forms an input signal 630 to an active repeater die 610. The higher energy output signal 640 from the repeater die is conveyed, via the multi-die interconnect bridge 120, as an input signal 620A to the second semiconductor die 110B.

Although the active element 610 is depicted as conductively coupled to the upper surface of the multi-die interconnect bridge 120, in other embodiments, the active element 610 may be conductively coupled to the upper surface of the multi-die interconnect bridge 120, the lower surface of the multi-die interconnect bridge 120, or any combination thereof.

Figure 7:
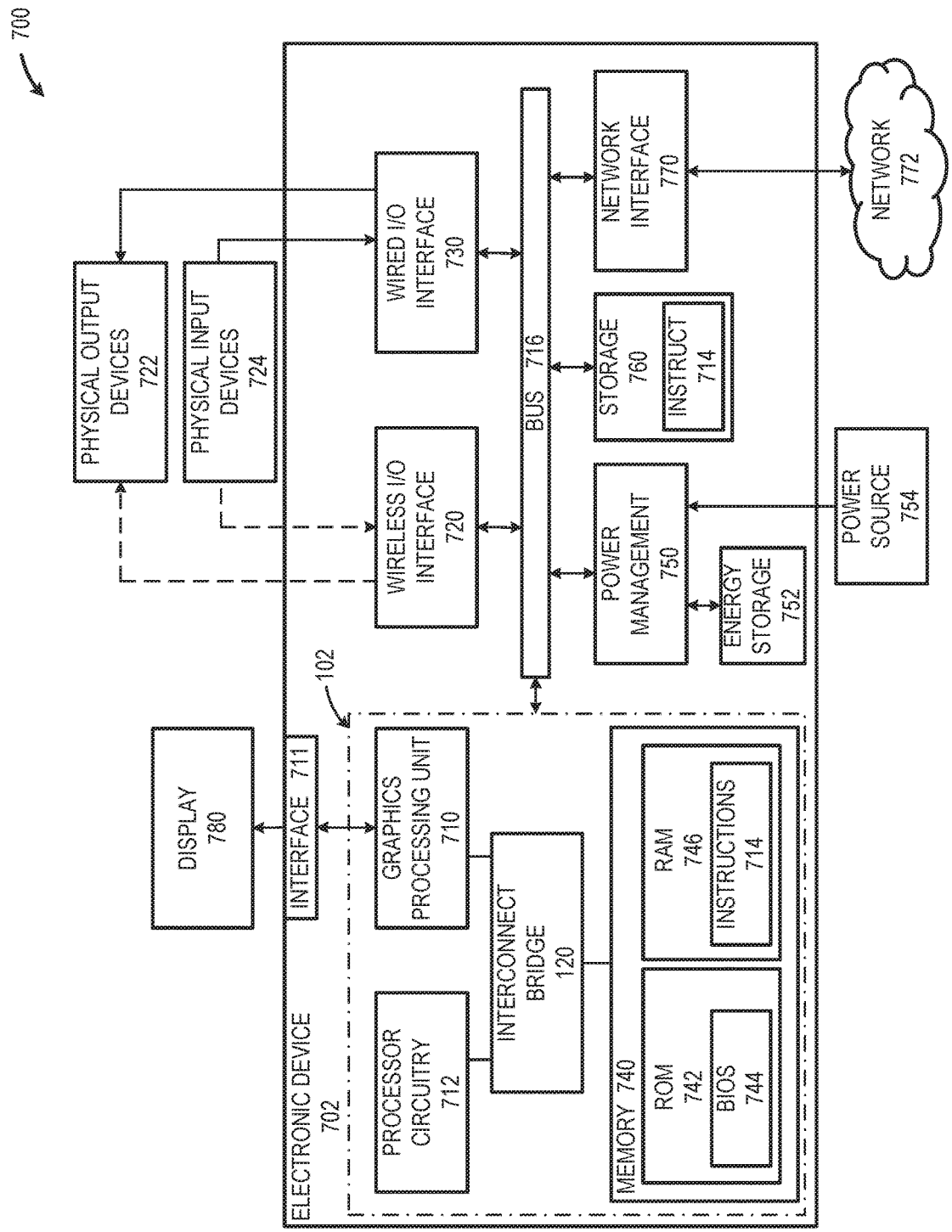
FIG. 7 is a schematic diagram of an illustrative electronic device that includes a system-in-chip (SiC) that includes a multi-die interconnect bridge as described in FIGS. 1 through 6 conductively coupling a graphical processing unit, processor circuitry, and system memory, and in accordance with at least one embodiment described herein.

FIG. 7 is a schematic diagram of an illustrative electronic device 700 that includes a system-in-chip (SiC) 102 that includes a multi-die interconnect bridge 120 as described in FIGS. 1 through 6 conductively coupling a graphical processing unit 710, processor circuitry 712, and system memory 740, and in accordance with at least one embodiment described herein. The following discussion provides a brief, general description of the components forming the illustrative electronic device 702 such as a smartphone, wearable computing device, portable computing device, or any similar device having at least one system-in-chip 102 that includes a multi-die interconnect bridge 120. In embodiments, the multi-die interconnect bridge 120 may be partially or completely disposed in the substrate 130 to which the graphical processing unit 710, processor circuitry 712, and system memory 740 are operably coupled and physically affixed.

The electronic device 702 includes processor circuitry 712 capable of executing machine-readable instruction sets 714, reading data and/or instructions 714 from one or more storage devices 760 and writing data to the one or more storage devices 760. Those skilled in the relevant art will appreciate that the illustrated embodiments as well as other embodiments can be practiced with other circuit-based device configurations, including portable electronic or handheld electronic devices, for instance smartphones, portable computers, wearable computers, microprocessor-based or programmable consumer electronics, personal computers ("PCs"), network PCs, minicomputers, mainframe computers, and the like.

The processor circuitry 712 may include any number of hardwired or configurable circuits, some or all of which may include programmable and/or configurable combinations of electronic components, semiconductor devices, and/or logic elements that are disposed partially or wholly in a PC, server, or other computing system capable of executing processor-readable instructions.

The electronic device 702 includes a bus or similar communications link 716 that communicably couples and facilitates the exchange of information and/or data between various system components including the SiC 102, one or more wireless I/O interfaces 720, one or more wired I/O interfaces 730, one or more storage devices 760, and/or one or more network interfaces 770. The electronic device 702 may be referred to in the singular herein, but this is not intended to limit the embodiments to a single electronic device and/or system, since in certain embodiments, there may be more than one electronic device 702 that incorporates, includes, or contains any number of communicably coupled, collocated, or remote networked circuits or devices.

The SiC 102 includes a multi-die interconnect bridge 120 communicably coupling the graphics processing unit 710, the processor circuitry 712, and the system memory 740. In embodiments, a greater or lesser number of components may be included in the SiC 102. The graphics processing unit ("GPU") 710 may include any number and/or combination of systems and/or devices capable of generating a video output signal at a wired or wireless video output interface 711.

The processor circuitry 712 may include any number, type, or combination of devices. At times, the processor circuitry 712 may be implemented in whole or in part in the form of semiconductor devices such as diodes, transistors, inductors, capacitors, and resistors. Such an implementation may include, but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), programmable logic units, field programmable gate arrays (FPGAs), and the like. Unless described otherwise, the construction and operation of the various blocks shown in FIG. 7 are of conventional design. Consequently, such blocks need not be described in further detail herein, as they will be understood by those skilled in the relevant art. The bus 716 that interconnects at least some of the components of the electronic device 702 may employ any known serial or parallel bus structures or architectures.

The system memory 740 may include read-only memory ("ROM") 742 and random access memory ("RAM") 746. A portion of the ROM 742 may be used to store or otherwise retain a basic input/output system ("BIOS") 744. The BIOS 744 provides basic functionality to the electronic device 702, for example by causing the processor circuitry 712 to load one or more machine-readable instruction sets 714. In embodiments, at least some of the one or more machine-readable instruction sets 714 cause at least a portion of the processor circuitry 712 to provide, create, produce, transition, and/or function as a dedicated, specific, and particular machine, for example a word processing machine, a digital image acquisition machine, a media playing machine, a gaming system, a communications device, or similar.

The electronic device 702 may include at least one wireless input/output (I/O) interface 720. The at least one wireless I/O interface 720 may be communicably coupled to one or more physical output devices 722 (tactile devices, video displays, audio output devices, hardcopy output devices, etc.). The at least one wireless I/O interface 720 may communicably couple to one or more physical input devices 724 (pointing devices, touchscreens, keyboards, tactile devices, etc.). The at least one wireless I/O interface 720 may include any currently available or future developed wireless I/O interface. Example wireless I/O interfaces include, but are not limited to: BLUETOOTH®, near field communication (NFC), and similar.

The electronic device 702 may include one or more wired input/output (I/O) interfaces 730. The at least one wired I/O interface 730 may be communicably coupled to one or more physical output devices 722 (tactile devices, video displays, audio output devices, hardcopy output devices, etc.). The at least one wired I/O interface 730 may be communicably coupled to one or more physical input devices 724 (pointing devices, touchscreens, keyboards, tactile devices, etc.). The wired I/O interface 730 may include any currently available or future developed I/O interface. Example wired I/O interfaces include, but are not limited to: universal serial bus (USB) and similar.

The electronic device 702 may include one or more communicably coupled, non-transitory, data storage devices 760. The data storage devices 760 may include one or more hard disk drives and/or one or more solid-state storage devices. The one or more data storage devices 760 may include any current or future developed storage appliances, network storage devices, and/or systems. Non-limiting examples of such data storage devices 760 may include, but are not limited to, any current or future developed non-transitory storage appliances or devices, such as one or more magnetic storage devices, one or more optical storage devices, one or more electro-resistive storage devices, one or more molecular storage devices, one or more quantum storage devices, or various combinations thereof. In some implementations, the one or more data storage devices 760 may include one or more removable storage devices, such as one or more flash drives, flash memories, flash storage units, or similar appliances or devices capable of communicable coupling to and decoupling from the electronic device 702.

The one or more data storage devices 760 may include interfaces or controllers (not shown) communicatively coupling the respective storage device or system to the bus 716. The one or more data storage devices 760 may store, retain, or otherwise contain machine-readable instruction sets, data structures, program modules, data stores, databases, logical structures, and/or other data useful to the processor circuitry 712 and/or one or more applications executed on or by the processor circuitry 712. In some instances, one or more data storage devices 760 may be communicably coupled to the processor circuitry 712, for example via the bus 716 or via one or more wired communications interfaces 730 (e.g., Universal Serial Bus or USB); one or more wireless communications interfaces 720 (e.g., Bluetooth®, Near Field Communication or NFC); and/or one or more network interfaces 770 (IEEE 802.3 or Ethernet, IEEE 802.11, or WiFi®, etc.).

Processor-readable instruction sets 714 and other programs, applications, logic sets, and/or modules may be stored in whole or in part in the system memory 740. Such instruction sets 714 may be transferred, in whole or in part, from the one or more data storage devices 760. The instruction sets 714 may be loaded, stored, or otherwise retained in system memory 740, in whole or in part, during execution by the processor circuitry 712. The processor-readable instruction sets 714 may include machine-readable and/or processor-readable code, instructions, or similar logic capable of providing the speech coaching functions and capabilities described herein.

The electronic device 702 may include power management circuitry 750 that controls one or more operational aspects of the energy storage device 752. In embodiments, the energy storage device 752 may include one or more primary (i.e., non-rechargeable) or secondary (i.e., rechargeable) batteries or similar energy storage devices. In embodiments, the energy storage device 752 may include one or more supercapacitors or ultracapacitors. In embodiments, the power management circuitry 750 may alter, adjust, or control the flow of energy from an external power source 754 to the energy storage device 752 and/or to the electronic device 702. The power source 754 may include, but is not limited to, a solar power system, a commercial electric grid, a portable generator, an external energy storage device, or any combination thereof.

For convenience, the SiC 102, the wireless I/O interface 720, the wired I/O interface 730, the power management circuitry 750, the storage device 760, and the network interface 770 are illustrated as communicatively coupled to each other via the bus 716, thereby providing connectivity between the above-described components. In alternative embodiments, the above-described components may be communicatively coupled in a different manner than illustrated in FIG. 7. For example, one or more of the above-described components may be directly coupled to other components, or may be coupled to each other, via one or more intermediary components (not shown). In another example, one or more of the above-described components may be integrated into the SiC 102 and communicably coupled to other components via the multi-die interconnect bridge 120. In some embodiments, all or a portion of the bus 716 may be omitted and the components are coupled directly to each other using suitable wired or wireless connections.

Figure 8:
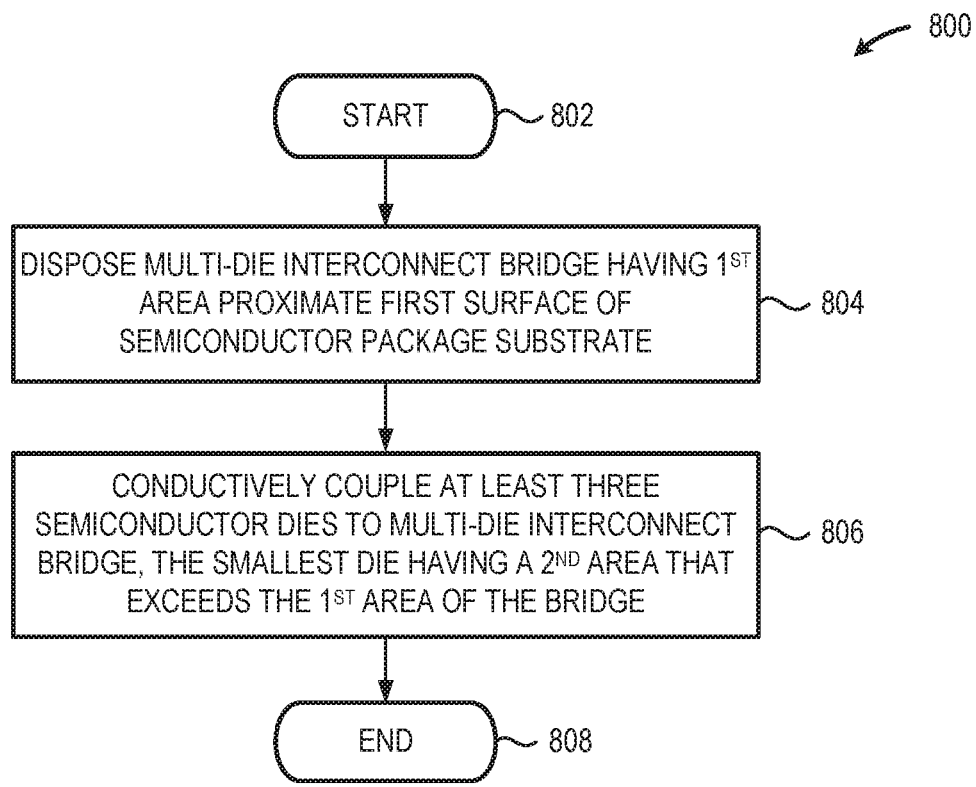
FIG. 8 is a high-level flow diagram of an illustrative method of fabricating a semiconductor package, such as a system-in-chip, that incorporates at least one multi-die interconnect bridge that communicably couples at least three semiconductor dies, in accordance with at least one embodiment described herein.

FIG. 8 is a high-level flow diagram of an illustrative method 800 of fabricating a semiconductor package 102, such as a system-in-chip, that incorporates at least one multi-die interconnect bridge 120 that communicably couples at least three semiconductor dies 110, in accordance with at least one embodiment described herein. The multi-die interconnect bridge 120 may be at least partially embedded or otherwise incorporated into the semiconductor package substrate 130. The multi-die interconnect bridge 120 conductively couples each of the at least three semiconductor dies 110 to each of the remaining semiconductor dies 110, beneficially providing the physically shortest distance between each of the semiconductor dies 110. In embodiments, the multi-die interconnect bridge 120 is a passive bridge (i.e., a bridge that contains no intrinsic active components) formed in, on, or about a silicon die. In embodiments, the multi-die interconnect bridge 120 may be fabricated independent of the semiconductor package 102 and may be incorporated into the semiconductor package substrate 130 during the package fabrication or assembly process. The method 800 commences at 802.

At 804, a multi-die interconnect bridge 120 is disposed, positioned, patterned, or otherwise affixed, bonded or attached to, deposited on, or at least partially embedded in a first surface of a semiconductor package substrate 130. In embodiments, the multi-die interconnect bridge 120 may include any number and/or combination of passive elements (conductors, resistors, capacitors, inductors, etc.) disposed a silicon die. In embodiments, the multi-die interconnect bridge 120 may include any number and/or combination of passive elements formed integrally in, on, across, or about the semiconductor package substrate 130. In embodiments, the multi-die interconnect bridge 120 may include any number and/or combination of passive elements disposed as a single or as multiple layers in a layered dielectric structure such as a circuit board.

In some embodiments, the multi-die interconnect bridge 120 may be disposed in a recessed region formed on the first surface 132 of the semiconductor package substrate 130. In such embodiments, the upper surface of the multi-die interconnect bridge 120 may project above the first surface 132, may be recessed below the first surface 132, or may be coplanar with the first surface 132 of the semiconductor package substrate 130. In some embodiments, the multi-die interconnect bridge 120 may be physically affixed, for example via chemical bonding, to the first surface 132 of the semiconductor package substrate 130.

The multi-die interconnect bridge 120 may have any physical geometry, size, and/or shape. For example, the multi-die interconnect bridge 120 may have a rectangular, circular, oval, triangular, polygonal, or trapezoidal physical geometry. The multi-die interconnect bridge 120 may have any thickness, longitudinal, and lateral dimensions. In at least some embodiments, the physical geometry, thickness, lateral dimension and longitudinal dimension of the multi-die interconnect bridge 120 may be based, at least in part, on the physical size, shape, and/or the configuration of the contact elements 112A-112n proximate the multi-die interconnect bridge 120 and disposed on the exterior of the semiconductor dies 110. In embodiments, the multi-die interconnect bridge 120 may conductively couple each of the at least three semiconductor dies 110 to each of the remaining at least three semiconductor dies 110. In other embodiments, the multi-die interconnect bridge 120 may selectively conductively couple each of some or all of the at least three semiconductor dies 110 to each of at least some of the remaining at least three semiconductor dies 110.

At 806, at least three semiconductor dies 110 are conductively coupled to the multi-die interconnect bridge 120. In embodiments, each of the semiconductor dies 110 may have a plurality of contact elements 112 patterned, deposited, formed, or otherwise disposed in, on, about or across at least a portion of the external surface of the respective semiconductor die 110. Conductive structures, including solder balls 152 and/or solder bumps 154 may be conductively coupled to some or all of the contact elements 112. In at least some embodiments, at least some of the conductive structures (e.g., solder bumps 154) may be reflowed to conductively couple the semiconductor die 110 to the multi-die interconnect bridge 120. In at least some embodiments, at least some of the conductive structures (e.g., solder balls 152) may be reflowed to conductively couple the semiconductor die 110 to the semiconductor package substrate 130. In embodiments, other conductive coupling methods may be used to conductively couple the semiconductor dies 110 to the multi-die interconnect bridge 120.

The multi-die interconnect bridge 120 occupies a first area on the first surface 132 of the semiconductor package substrate 130. The smallest of the at least three semiconductor dies 110 occupies a second area on the first surface 132 of the semiconductor package substrate 130. In embodiments the first area (occupied by the multi-die interconnect bridge 120) is less than the second area (occupied by the smallest of the at least three semiconductor dies 110). The method 800 concludes at 808.

Figure 9:
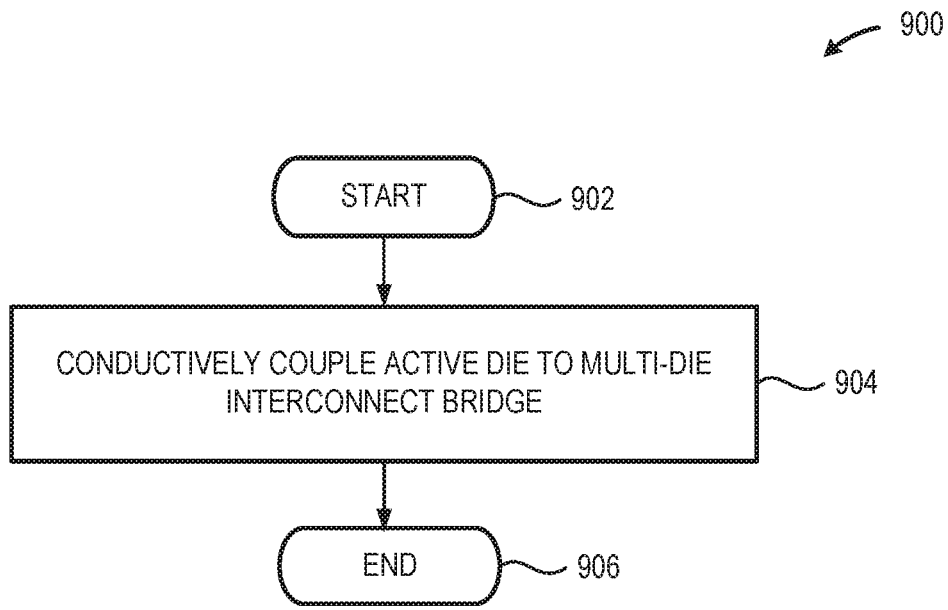
FIG. 9 is a high-level flow diagram of an illustrative method of conductively coupling one or more active dies to a passive multi-die interconnect bridge, in accordance with at least one embodiment described herein.

FIG. 9 is a high-level flow diagram of an illustrative method 900 of conductively coupling one or more active dies 610 to a passive multi-die interconnect bridge 120, in accordance with at least one embodiment described herein. The method 900 may be used in conjunction with the method 800 discussed above with regard to FIG. 8. In embodiments, one or more active dies 610, such as one or more dies containing control circuitry and/or repeater circuitry, may be conductively coupled to a passive multi-die interconnect bridge 120 to provide additional functionality. The method 900 commences at 902.

At 904, an active die 610 (i.e., a die that includes at least one active electronic and/or semiconductor component) is conductively coupled to the multi-die interconnect bridge 120. In embodiments, at least a portion of the communication paths 122 through the multi-die interconnect bridge 120 pass through the active die 610. In other embodiments, signals passing between selected semiconductor dies 110 pass through the active die 610. For example, semiconductor dies 110A, 110B, and 110C are conductively coupled to the multi-die interconnect bridge 120. The communication path $122_{A-B}$ between dies 110A and 110B pass through an active die 610 coupled to the multi-die interconnect bridge 120 while the communication path 122A_c between dies 110A and 110C and the communication path $122_{B-C}$ between 110B and 110C are communicated via the multi-die interconnect bridge 120 but do not pass through the active die 610. In other embodiments, all of the communication paths 122 through the multi-die interconnect bridge 120 pass through the active die 610. The method 900 concludes at 912.

While FIGS. 8 and 9 illustrate various operations according to one or more embodiments, it is to be understood that not all of the operations depicted in FIGS. 8 and 9 are necessary for other embodiments. Indeed, it is fully contemplated herein that in other embodiments of the present disclosure, the operations depicted in FIGS. 8 and 9, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), rewritable compact disks (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to systems and methods of conductively coupling at least three semiconductor dies included in a semiconductor package using a multi-die interconnect bridge that is embedded, disposed, or otherwise integrated into the semiconductor package substrate. The multi-die interconnect bridge is a passive device that includes passive electronic components such as conductors, resistors, capacitors and inductors. The multi-die interconnect bridge communicably couples each of the semiconductor dies included in the at least three semiconductor dies to each of at least some of the remaining at least three semiconductor dies. An active silicon die, such as a silicon die containing control circuitry and/or repeater circuitry may be coupled to the multi-die interconnect bridge to provide additional functionality. The multi-die interconnect bridge occupies a first area on the surface of the semiconductor package substrate. The smallest of the at least three semiconductor dies coupled to the multi-die interconnect bridge 120 occupies a second area on the surface of the semiconductor package substrate, where the second area is greater than the first area.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for providing an externally accessible test wirebond in a semiconductor package mounted on a substrate.

According to example 1, there is provided a semiconductor package. The semiconductor package includes: a semiconductor package substrate having a first surface and a transversely opposed second surface separated by a thickness; at least three semiconductor dies coupled to the semiconductor package substrate; where a smallest of the at least three semiconductor dies occupies a first physical area on the first surface of the semiconductor package substrate; and a multi-die interconnect bridge that includes one or more conductive members disposed proximate the first surface of the semiconductor package substrate and occupying a second physical area of the first surface of the semiconductor package substrate; wherein the multi-die interconnect bridge conductively couples each of the at least three semiconductor dies to each of the remaining at least three semiconductor dies; and wherein the second physical area occupied by the multi-die interconnect bridge is less than the first physical area of a smallest of the at least three semiconductor dies.

Example 2 may include elements of example 1 where the one or more conductive members included in the multi-die interconnect bridge conductively couple the at least three semiconductor dies without passing through any intervening semiconductor die included in the at least three silicon dies.

Example 3 may include elements of any of examples 1 and 2, and the semiconductor package may additionally include an active die communicably coupled to the multi-die interconnect bridge.

Example 4 may include elements of any of examples 1 through 3 where the active die comprises control circuitry.

Example 5 may include elements of any of examples 1 through 4 where the active die comprises a repeater die.

Example 6 may include elements of any of examples 1 through 5 where the multi-die interconnect bridge defines a shortest distance between each of the at least three semiconductor dies and the remaining at least three semiconductor dies.

Example 7 may include elements of any of examples 1 through 6 where the multi-die interconnect bridge comprises a silicon die embedded at least partially in the first surface of the semiconductor package substrate.

Example 8 may include elements of any of examples 1 through 7 where the multi-die interconnect bridge comprises a silicon bridge formed integral with the semiconductor package substrate.

According to example 9 there is provided a semiconductor package fabrication method, comprising disposing a multi-die interconnect bridge that includes a plurality of conductive members proximate a first surface of a semiconductor package substrate, the multi-die interconnect bridge occupying a first physical area of the first surface of the semiconductor package substrate; and
conductively coupling each of at least three semiconductor dies to the multi-die interconnect bridge such that the plurality of conductive members conductively couples each of the at least three semiconductor dies to the remaining at least three semiconductor dies; where a smallest of the at least three semiconductor dies occupies a second physical area on the first surface of the semiconductor package substrate; and where the first physical area occupied by the multi-die interconnect bridge is less than the second physical area of a smallest of the at least three semiconductor dies.

Example 10 may include elements of example 9 where forming a multi-die interconnect bridge that includes a plurality of conductive members proximate a first surface of a semiconductor package substrate further comprises: forming a multi-die interconnect bridge that includes a plurality of conductive members proximate a first surface of a semiconductor package substrate such that the plurality of conductive members included in the multi-die interconnect bridge conductively couple the at least three semiconductor dies without passing through any intervening semiconductor die included in the at least three silicon dies.

Example 11 may include elements of any of examples 9 or 10 and the method may additionally include: conductively coupling at least one active semiconductor die to the multi-die interconnect bridge.

Example 12 may include elements of any of examples 9 through 11 where conductively coupling at least one active semiconductor die to the multi-die interconnect bridge may include: conductively coupling at least one active semiconductor die that includes control circuitry to the multi-die interconnect bridge.

Example 13 may include elements of any of examples 9 through 12 where conductively coupling at least one active semiconductor die to the multi-die interconnect bridge may include: conductively coupling at least one active semiconductor die that includes a repeater die to the multi-die interconnect bridge.

Example 14 may include elements of any of examples 9 through 13 where conductively coupling each of at least three semiconductor dies to the multi-die interconnect bridge further comprises:
conductively coupling each of at least three semiconductor dies to the multi-die interconnect bridge that defines a shortest distance between each of the at least three semiconductor dies and the remaining at least three semiconductor dies.

Example 15 may include elements of any of examples 9 through 14 where disposing a multi-die interconnect bridge that includes a plurality of conductive members proximate a first surface of a semiconductor package substrate may include: at least partially embedding a silicon die in the first surface of the semiconductor package substrate to provide the multi-die interconnect bridge.

Example 16 may include elements of any of examples 9 through 15 where disposing a multi-die interconnect bridge that includes a plurality of conductive members proximate a first surface of a semiconductor package substrate may include: forming an integral silicon bridge in the thickness of the semiconductor package substrate.

According to example 17 there is provided a semiconductor package fabrication system. The system may include: means for disposing a multi-die interconnect bridge that includes a plurality of conductive members proximate a first surface of a semiconductor package substrate, the multi-die interconnect bridge occupying a first physical area of the first surface of the semiconductor package substrate; and means for conductively coupling each of at least three semiconductor dies to the multi-die interconnect bridge such that the plurality of conductive members conductively couples each of the at least three semiconductor dies to the remaining at least three semiconductor dies; where a smallest of the at least three semiconductor dies occupies a second physical area on the first surface of the semiconductor package substrate; and where the first physical area occupied by the multi-die interconnect bridge is less than the second physical area of a smallest of the at least three semiconductor dies.

Example 18 may include elements of example 17 where the means for forming a multi-die interconnect bridge that includes a plurality of conductive members proximate a first surface of a semiconductor package substrate may further include: means for forming a multi-die interconnect bridge that includes a plurality of conductive members proximate a first surface of a semiconductor package substrate such that the plurality of conductive members included in the multi-die interconnect bridge conductively couple the at least three semiconductor dies without passing through any intervening semiconductor die included in the at least three silicon dies.

Example 19 may include elements of any of examples 17 or 18 and the system may further include: means for conductively coupling at least one active semiconductor die to the multi-die interconnect bridge.

Example 20 may include elements of any of examples 17 through 19 where the means for conductively coupling at least one active semiconductor die to the multi-die interconnect bridge may include: means for conductively coupling at least one active semiconductor die that includes control circuitry to the multi-die interconnect bridge.

Example 21 may include elements of any of examples 17 through 20 where the means for conductively coupling at least one active semiconductor die to the multi-die interconnect bridge may include: means for conductively coupling at least one active semiconductor die that includes a repeater die to the multi-die interconnect bridge.

Example 22 may include elements of any of examples 17 through 21 where the means for conductively coupling each of at least three semiconductor dies to the multi-die interconnect bridge may further include: means for conductively coupling each of at least three semiconductor dies to the multi-die interconnect bridge that defines a shortest distance between each of the at least three semiconductor dies and the remaining at least three semiconductor dies.

Example 23 may include elements of any of examples 17 through 22 where the means for disposing a multi-die interconnect bridge that includes a plurality of conductive members proximate a first surface of a semiconductor package substrate may include: means for at least partially embedding a silicon die in the first surface of the semiconductor package substrate to provide the multi-die interconnect bridge.

Example 24 may include elements of any of examples 17 through 23 where the means for disposing a multi-die interconnect bridge that includes a plurality of conductive members proximate a first surface of a semiconductor package substrate may include: means for forming an integral silicon bridge in the thickness of the semiconductor package substrate.

According to example 25 there is provided an electronic device. The electronic device may include: a printed circuit board; a semiconductor package conductively coupled to the printed circuit board, the semiconductor package including: a semiconductor package substrate coupled to the printed circuit board, the semiconductor package substrate having a first surface and a transversely opposed second surface separated by a thickness; at least three semiconductor dies included in the semiconductor package and coupled to the first surface of the semiconductor package substrate; where a smallest of the at least three semiconductor dies occupies a first physical area on the first surface of the semiconductor package substrate; and a multi-die interconnect bridge disposed proximate the first surface of the semiconductor package substrate, the multi-die interconnect bridge including one or more conductive members and occupying a second physical area of the first surface of the semiconductor package substrate; where the multi-die interconnect bridge conductively couples each of the at least three semiconductor dies to each of the remaining at least three semiconductor dies; and where the second physical area occupied by the multi-die interconnect bridge is less than the first physical area of a smallest of the at least three semiconductor dies.

Example 26 may include elements of example 25 where the one or more conductive members included in the multi-die interconnect bridge conductively couple the at least three semiconductor dies without passing through any intervening semiconductor die included in the at least three silicon dies.

Example 27 may include elements of any of examples 25 or 26 where the semiconductor package further includes an active die communicably coupled to the multi-die interconnect bridge.

Example 28 may include elements of any of examples 25 through 27 where the active die comprises control circuitry.

Example 29 may include elements of any of examples 25 through 28 where the active die comprises repeater circuitry.

Example 30 may include elements of any of examples 25 through 29 where the silicon bridge defines a shortest distance between each of the at least three semiconductor dies and the remaining at least three semiconductor dies.

Example 31 may include elements of any of examples 25 through 30 where the multi-die interconnect bridge comprises a silicon die embedded at least partially in the first surface of the semiconductor package substrate.

Example 32 may include elements of any of examples 25 through 31 where the multi-die interconnect bridge comprises a silicon bridge formed integral with the semiconductor package substrate.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A semiconductor package comprising:
   a semiconductor package substrate having a first surface and a transversely opposed second surface separated by a thickness;
   at least four semiconductor dies coupled to the semiconductor package substrate;

wherein a smallest of the at least four semiconductor dies occupies a first physical area on the first surface of the semiconductor package substrate;

a first multi-die interconnect bridge that includes one or more conductive members disposed proximate the first surface of the semiconductor package substrate and occupying a second physical area of the first surface of the semiconductor package substrate;

a second multi-die interconnect bridge that includes one or more conductive members disposed proximate the first surface of the semiconductor package substrate;

wherein a first semiconductor die included in the at least four semiconductor dies comprises a semiconductor die having a first gate pitch;

wherein a second semiconductor die included in the at least four semiconductor dies includes a semiconductor die having a second gate pitch, the second gate pitch less than the first gate pitch;

wherein the first multi-die interconnect bridge conductively couples each of three of the at least four semiconductor dies to each of the remaining of the three of the at least four semiconductor dies, wherein only two of the three of the at least four semiconductor dies are coupled to the second multi-die interconnect bridge, and wherein a fourth of the at least four semiconductor dies is coupled to the second multi-die interconnect bridge but not to the first multi-die interconnect bridge;

wherein the one or more conductive members included in the first multi-die interconnect bridge conductively couple the three of the at least four semiconductor dies without passing through any intervening semiconductor die included in the three of the at least four semiconductor dies; and wherein the second physical area occupied by the first multi-die interconnect bridge is less than the first physical area of the smallest of the at least four semiconductor dies; and a plurality of solder balls on the second surface of the semiconductor package, a first and a second of the plurality of solder balls within the second physical area occupied by the first multi-die interconnect bridge, wherein the first of the plurality of solder balls is coupled to one of the at least four semiconductor dies, and wherein the second of the plurality of solder balls is coupled to another of the at least four semiconductor dies.

2. The semiconductor package of claim 1, further comprising an active die communicably coupled to the first multi-die interconnect bridge.

3. The semiconductor package of claim 1 wherein the active die comprises at least one of: control circuitry and repeater circuitry.

4. The semiconductor package of claim 1 wherein the first multi-die interconnect bridge defines a shortest distance between each of the three of the at least four semiconductor dies and the remaining of the three of the at least four semiconductor dies.

5. The semiconductor package of claim 1 wherein the first multi-die interconnect bridge comprises a silicon die embedded at least partially in the first surface of the semiconductor package substrate.

6. The semiconductor package of claim 1 wherein the first multi-die interconnect bridge comprises a silicon bridge formed integral with the semiconductor package substrate.

7. A semiconductor package fabrication method, comprising:

disposing a first multi-die interconnect bridge that includes a plurality of conductive members proximate a first surface of a semiconductor package substrate, the first multi-die interconnect bridge occupying a first physical area of the first surface of the semiconductor package substrate, and the semiconductor package substrate having a second surface opposite the first surface;

disposing a second multi-die interconnect bridge that includes one or more conductive members disposed proximate the first surface of the semiconductor package substrate;

conductively coupling each of three of at least four semiconductor dies to the first multi-die interconnect bridge such that the plurality of conductive members conductively couples each of the three of the at least four semiconductor dies to the remaining of the three of the at least four semiconductor dies;

wherein a first semiconductor die included in the at least four semiconductor dies comprises a semiconductor die having a first gate pitch;

wherein a second semiconductor die included in the at least four semiconductor dies includes a semiconductor die having a second gate pitch, the second gate pitch less than the first gate pitch;

wherein a smallest of the at least four semiconductor dies occupies a second physical area on the first surface of the semiconductor package substrate;

wherein the one or more conductive members included in the first multi-die interconnect bridge conductively couple the three of the at least four semiconductor dies without passing through any intervening semiconductor die included in the three of the at least four semiconductor dies, and wherein only two of the three of the at least four semiconductor dies are coupled to the second multi-die interconnect bridge, and wherein a fourth of the at least four semiconductor dies is coupled to the second multi-die interconnect bridge but not to the first multi-die interconnect bridge; and wherein the first physical area occupied by the first multi-die interconnect bridge is less than the second physical area of the smallest of the at least four semiconductor dies; and coupling a plurality of solder balls to the second surface of the semiconductor package substrate, a first and a second of the plurality of solder balls within the first physical area occupied by the first multi-die interconnect bridge, wherein the first of the plurality of solder balls is coupled to one of the at least four semiconductor dies, and wherein the second of the plurality of solder balls is coupled to another of the at least four semiconductor dies.

8. The method of claim 7 wherein disposing the first multi-die interconnect bridge that includes a plurality of conductive members proximate a first surface of a semiconductor package substrate comprises:

at least partially embedding a silicon die in the first surface of the semiconductor package substrate to provide the first multi-die interconnect bridge.

9. The method of claim 7 wherein disposing the first multi-die interconnect bridge that includes a plurality of conductive members proximate a first surface of a semiconductor package substrate comprises:

forming an integral silicon bridge in the thickness of the semiconductor package substrate.

10. The method of claim 7, further comprising:

conductively coupling at least one active semiconductor die to the first multi-die interconnect bridge.

11. The method of claim 10, wherein conductively coupling at least one active semiconductor die to the first multi-die interconnect bridge comprises:
 conductively coupling at least one active semiconductor die that includes at least one of: control circuitry and repeater circuitry to the first multi-die interconnect bridge.

12. The method of claim 10 wherein conductively coupling each of the three of the at least four semiconductor dies to the first multi-die interconnect bridge further comprises:
 conductively coupling each of the three of the at least four semiconductor dies to the first multi-die interconnect bridge that defines a shortest distance between each of the three of the at least four semiconductor dies and the remaining of the three of the at least four semiconductor dies.

13. A semiconductor package fabrication system, comprising:
 means for disposing a first multi-die interconnect bridge that includes a plurality of conductive members proximate a first surface of a semiconductor package substrate, the first multi-die interconnect bridge occupying a first physical area of the first surface of the semiconductor package substrate, and the semiconductor package substrate having a second surface opposite the first surface;
 means for disposing a second multi-die interconnect bridge that includes one or more conductive members disposed proximate the first surface of the semiconductor package substrate;
 means for conductively coupling each of three of at least four semiconductor dies to the first multi-die interconnect bridge such that the plurality of conductive members conductively couples each of the three of the at least four semiconductor dies to the remaining three of the at least four semiconductor dies;
 wherein a first semiconductor die included in the at least four semiconductor dies comprises a semiconductor die having a first gate pitch;
 wherein a second semiconductor die included in the at least four semiconductor dies includes a semiconductor die having a second gate pitch, the second gate pitch less than the first gate pitch;
 wherein a smallest of the at least four semiconductor dies occupies a second physical area on the first surface of the semiconductor package substrate;
 wherein the one or more conductive members included in the first multi-die interconnect bridge conductively couple the three of the at least four semiconductor dies without passing through any intervening semiconductor die included in the three of the at least four semiconductor dies, and wherein only two of the three of the at least four semiconductor dies are coupled to the second multi-die interconnect bridge, and wherein a fourth of the at least four semiconductor dies is coupled to the second multi-die interconnect bridge but not to the first multi-die interconnect bridge; and
 wherein the first physical area occupied by the first multi-die interconnect bridge is less than the second physical area of the smallest of the at least four semiconductor dies; and
 means for coupling a plurality of solder balls to the second surface of the semiconductor package substrate, a first and a second of the plurality of solder balls within the first physical area occupied by the first multi-die interconnect bridge, wherein the first of the plurality of solder balls is coupled to one of the at least four semiconductor dies, and wherein the second of the plurality of solder balls is coupled to another of the at least four semiconductor dies.

14. The system of claim 13 wherein the means for conductively coupling each of the three of the at least four semiconductor dies to the first multi-die interconnect bridge further comprises:
 means for conductively coupling each of the three of the at least four semiconductor dies to the first multi-die interconnect bridge that defines a shortest distance between each of the three of the at least four semiconductor dies and the remaining of the three of the at least four semiconductor dies.

15. The system of claim 13 wherein the means for disposing a first multi-die interconnect bridge that includes a plurality of conductive members proximate a first surface of a semiconductor package substrate comprises:
 means for at least partially embedding a silicon die in the first surface of the semiconductor package substrate to provide the first multi-die interconnect bridge.

16. The system of claim 13 wherein the means for disposing the first multi-die interconnect bridge that includes a plurality of conductive members proximate a first surface of a semiconductor package substrate comprises:
 means for forming an integral silicon bridge in the thickness of the semiconductor package substrate.

17. The system of claim 13, further comprising:
 means for conductively coupling at least one active semiconductor die to the first multi-die interconnect bridge.

18. The system of claim 17, wherein the means for conductively coupling at least one active semiconductor die to the first multi-die interconnect bridge comprises:
 means for conductively coupling at least one active semiconductor die that includes at least one of: control circuitry or repeater circuitry to the first multi-die interconnect bridge.

19. An electronic device comprising:
 a printed circuit board;
 a semiconductor package conductively coupled to the printed circuit board, the semiconductor package including:
 a semiconductor package substrate coupled to the printed circuit board, the semiconductor package substrate having a first surface and a transversely opposed second surface separated by a thickness;
 at least four semiconductor dies included in the semiconductor package and coupled to the first surface of the semiconductor package substrate;
 wherein a smallest of the at least four semiconductor dies occupies a first physical area on the first surface of the semiconductor package substrate; and
 a first multi-die interconnect bridge disposed proximate the first surface of the semiconductor package substrate, the first multi-die interconnect bridge including one or more conductive members and occupying a second physical area of the first surface of the semiconductor package substrate;
 a second multi-die interconnect bridge that includes one or more conductive members disposed proximate the first surface of the semiconductor package substrate;
 wherein a first semiconductor die included in the at least four semiconductor dies comprises a semiconductor die having a first gate pitch;
 wherein a second semiconductor die included in the at least four semiconductor dies includes a semiconductor die having a second gate pitch, the second gate pitch less than the first gate pitch;

wherein the first multi-die interconnect bridge conductively couples each of three of the at least four semiconductor dies to each of the remaining of the three of the at least four semiconductor dies;

wherein the one or more conductive members included in the first multi-die interconnect bridge conductively couple the three of the at least four semiconductor dies without passing through any intervening semiconductor die included in the three of the at least four semiconductor dies, and wherein only two of the three of the at least four semiconductor are coupled to the second multi-die interconnect bridge, and wherein a fourth of the at least four semiconductor dies is coupled to the second multi-die interconnect bridge but not to the first multi-die interconnect bridge; and wherein the second physical area occupied by the first multi-die interconnect bridge is less than the first physical area of the smallest of the at least four semiconductor dies; and a plurality of solder balls on the second surface of the semiconductor package, a first and a second of the plurality of solder balls within the second physical area occupied by the first multi-die interconnect bridge, the plurality of solder balls coupled to the printed circuit board, wherein the first of the plurality of solder balls is coupled to one of the at least four semiconductor dies, and wherein the second of the plurality of solder balls is coupled to another of the at least four semiconductor dies.

20. The electronic device of claim 19, wherein the semiconductor package further includes an active die communicably coupled to the first multi-die interconnect bridge.

21. The electronic device of claim 20, wherein the active die comprises at least one of: control circuitry and repeater circuitry.

\* \* \* \* \*